United States Patent
Vogt et al.

(10) Patent No.: US 7,105,279 B2
(45) Date of Patent: Sep. 12, 2006

(54) METHOD FOR FABRICATING A PATTERNED LAYER ON A SEMICONDUCTOR SUBSTRATE

(75) Inventors: Mirko Vogt, Dresden (DE); Alexander Hausmann, Dresden (DE)

(73) Assignee: Infineon Technologies AG, Munich (DE)

( * ) Notice: Subject to any disclaimer, the term of this patent is extended or adjusted under 35 U.S.C. 154(b) by 214 days.

(21) Appl. No.: 10/424,507

(22) Filed: Apr. 28, 2003

(65) Prior Publication Data
US 2004/0248046 A1    Dec. 9, 2004

(30) Foreign Application Priority Data
Apr. 27, 2002  (DE)  ................................. 102 18 955

(51) Int. Cl.
*G03F 7/00*  (2006.01)
(52) U.S. Cl. ........................ 430/313; 430/317; 430/950
(58) Field of Classification Search ................ 430/313, 430/317, 950
See application file for complete search history.

(56) References Cited

U.S. PATENT DOCUMENTS

| | | | |
|---|---|---|---|
| 4,226,896 A * | 10/1980 | Coburn et al. .............. 427/490 |
| 5,418,019 A | 5/1995 | Chen et al. ................. 427/579 |
| 5,472,827 A * | 12/1995 | Ogawa et al. .............. 430/315 |
| 5,674,356 A * | 10/1997 | Nagayama ................... 438/694 |
| 6,060,132 A * | 5/2000 | Lee ............................. 427/579 |
| 6,093,973 A * | 7/2000 | Ngo et al. ................... 257/797 |
| 6,174,816 B1 | 1/2001 | Yin et al. .................... 438/705 |
| 6,200,734 B1 * | 3/2001 | Blatchford et al. ......... 430/313 |
| 6,331,379 B1 | 12/2001 | Ireland et al. .............. 430/317 |
| 6,368,988 B1 * | 4/2002 | Li et al. ...................... 438/792 |
| 6,562,544 B1 * | 5/2003 | Cheung et al. ............. 430/313 |
| 6,696,157 B1 * | 2/2004 | David et al. ................. 428/408 |
| 6,720,097 B1 * | 4/2004 | Ohkawa et al. ............. 428/701 |

FOREIGN PATENT DOCUMENTS

| | | |
|---|---|---|
| EP | 0 379 604 A1 | 8/1990 |
| WO | WO 99/10918 | 3/1999 |

* cited by examiner

*Primary Examiner*—Nicole Barreca
(74) *Attorney, Agent, or Firm*—Laurence A. Greenberg; Werner H. Stemer; Ralph E. Locher

(57) ABSTRACT

During the patterning of a semiconductor layer, an N-free $SiO_x$ layer is produced under an acid-forming photoresist layer in order to prevent a resist degradation. The Si content of the grown $SiO_x$ layer being varied in order to set a desired extinction coefficient k and a desired refractive index n. The $SiO_x$ layer formation is effected by a vapor phase deposition, $SiH_4$ and $O_2$ being used as starting gases.

10 Claims, 3 Drawing Sheets

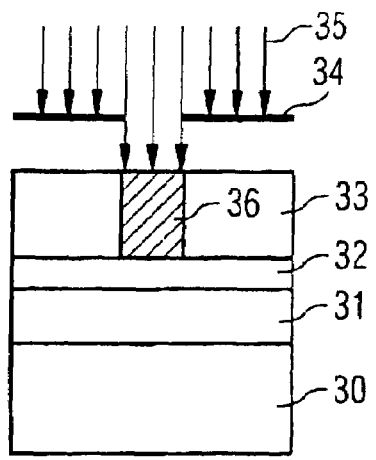
FIG. 1A Prior Art
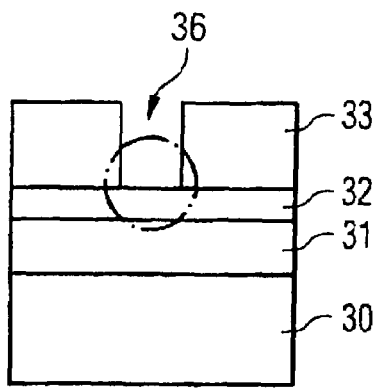
FIG. 1B Prior Art
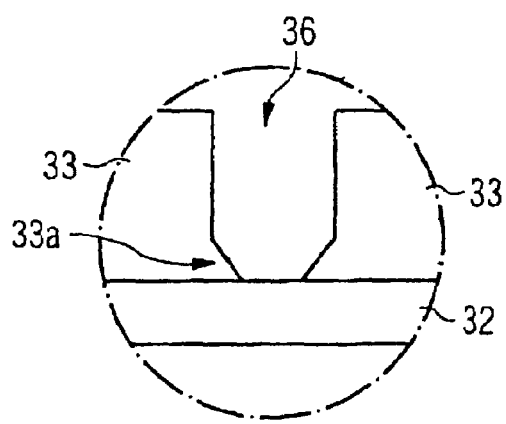
FIG. 1C Prior Art
FIG. 2A
FIG. 2B
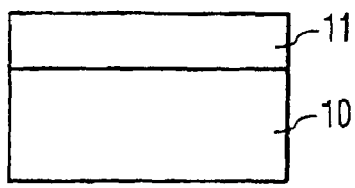
FIG. 2C
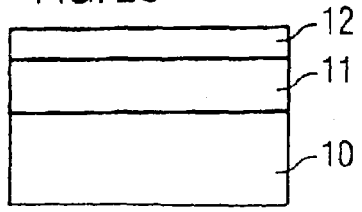
FIG. 2D
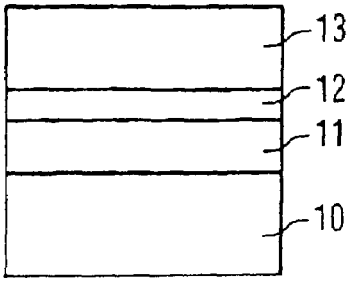

—◇— Refractive Index
—□— Extinction Coefficient

METHOD FOR FABRICATING A PATTERNED LAYER ON A SEMICONDUCTOR SUBSTRATE

BACKGROUND OF THE INVENTION

Field of the Invention

The invention relates to a method for the photolithographic patterning of layers on a semiconductor substrate.

In order to realize large scale integrated electrical circuits with small structural dimensions, the planar technique is usually used, in which the semiconductor wafers are processed locally with the aid of lithographic methods. In this case, the structures are first produced by use of a photomask in a thin radiation-sensitive film on the oxidized semiconductor wafer and are then transferred to the underlying layers with the aid of special etching methods. As an alternative, the photoresist may, if appropriate, also itself serve as local masking e.g. in the context of an ion implantation, so that no etching is required for the mask transfer. In this case, the photoresist is irradiated generally with the aid of an exposure mask, light wavelengths into the deep UV region being used for the exposure. However, the photoresist can also be irradiated masklessly using an electron beam or by special masks with the aid of X-rays.

Photolithography can be subdivided into a positive and a negative resist technique, in which case, with positive resists, the photoresist at the exposed locations is decomposed during development, whereas the non-irradiated regions remain masked. In the negative resist technique, by contrast, in exactly the opposite fashion, the exposed locations are masked, while the unexposed resist is decomposed during development. Positive resists are usually used since smaller line widths can be achieved in this case. Positive resists generally contain a solid matrix material and a light-sensitive component that are brought together in a solvent. The matrix material used is primarily phenolic resin, which determines the thermal properties of the resist. The light-sensitive component then defines the wavelength range and the sensitivity of the photoresist.

A chemical reaction arises during the exposure of the positive resist, the resist transforming into an acid at the exposed locations, the acid exhibiting a high solubility in basic solutions. With the aid of a corresponding developer, the photoresist can then be removed at the exposed locations, as a result of which the structure of the exposure mask is transferred to the photoresist layer. The photoresist layer thus patterned is subsequently used as a mask for the processing of the underlying semiconductor layer.

In order to comply with the desired line widths in the patterning of semiconductor layers, it is important, in particular, for the exposure structure to be transferred to the photoresist layer as accurately as possible. Problems during the transfer of the structure arise in particular on account of undesired optical phenomena, primarily interference effects between the incident light radiation and light radiation reflected in the photoresist layer, which can lead to pronounced local intensity fluctuations in the photoresist and thus to an incomplete exposure. In order to reduce the interference effects, antireflection layers are therefore used between the layer to be patterned and the photoresist layer, which layers reduce the intensity of the reflected radiation by orders of magnitude. In this case, the antireflection layers used are primarily nitrogen-containing layers, in particular silicon oxynitride layers (SiON layers), since the desired optical properties can be established simply and accurately by way of the stochiometry of these layers. However, during the photolithography process, these nitrogen-containing antireflection layers can lead to undesired interactions with the light-sensitive photoresist situated thereon, whereby the photolithographic result can be adversely affected. This is because, as a result of an interaction between the nitrogen-containing surface of the dielectric antireflection layer with the light-sensitive photoresist, the chemical and/or physical properties of the photoresist layer may change in such a way that the photolithographic process is disturbed in the affected regions of the photoresist layer. In this case, there is the problem, in particular, that the acid which forms during the exposure in the photoresist, at the interface with the dielectric antireflection layer, is neutralized by the basic character of the nitrogen penetrating from the dielectric antireflection layer, so that, in these regions, the resist remains relatively poorly soluble and is then removed incompletely during the subsequent development. The photoresist residues that remain have a masking effect in the subsequent etching process, the photoresist residues being referred to as resist feet, reduce the dimensional accuracy of the transfer of the structure and, in the extreme case, can lead to the undesired connection of regions that should be isolated.

In order to reduce the interaction between the dielectric antireflection layer, in particular an SiON layer, with the photoresist layer deposited above it, U.S. Pat. No. 6,174,816 discloses a method for reducing resist degradation in which the antireflection layer is subjected to an additional sealing process step after the deposition process. In this case, the antireflection layer is exposed to oxygen-containing plasma or a liquid reagent, thereby reducing the nitrogen content at the surface of the antireflection layer.

SUMMARY OF THE INVENTION

It is accordingly an object of the invention to provide a method for fabricating a patterned layer on a semiconductor substrate that overcomes the above-mentioned disadvantages of the prior art methods of this general type, in which resist degradations can be avoided in a simple manner.

With the foregoing and other objects in view there is provided, in accordance with the invention, a method for fabricating a patterned layer. The method includes providing a semiconductor substrate having a layer to be patterned, producing an N-containing dielectric antireflection layer on the layer to be patterned, producing an N-free $SiO_x$ layer on the N-containing dielectric antireflection layer, producing a photoresist layer on the N-free $SiO_x$ layer, exposing the photoresist layer for imaging a predetermined structure on the photoresist layer, developing the photoresist layer for forming the photoresist layer in accordance with the predetermined structure imaged during the exposure resulting in a photoresist structure, and transferring the photoresist structure to the layer for patterning the layer.

According to the invention, in order to fabricate the patterned layer on the semiconductor substrate, after the production of the N-containing dielectric antireflection layer on the layer to be patterned, the N-free $SiO_x$ layer is deposited and only then is the photoresist layer produced thereon. The N-free $SiO_x$ layer produces a nitrogen barrier for the nitrogen contained in the underlying antireflection layer. This reliably prevents the situation where undesired interactions occur between the antireflection layer and the photoresist layer, in particular where penetrating nitrogen neutralizes acidic constituents of the resist or impedes the diffusion behavior of specific resist components and the photolithographic result could thus be adversely affected.

The configuration according to the invention thus avoids the production of resist feet and thereby improves the dimensional accuracy of the transfer of the structure of an exposure mask into a photoresist layer that is carried out during the photolithography process. In this case, the $SiO_x$ layer may at the same time be configured such that the reflection conditions and thus the effect of the underlying dielectric antireflection layer are not impaired or are even improved.

According to the invention, the method for fabricating a patterned layer may also be configured such that a Si-rich N-free $SiO_x$ layer where x is less than 2 is applied as a dielectric antireflection layer directly on the semiconductor layer to be patterned, the photoresist layer then being produced on said $SiO_x$ layer. The use of an N-free dielectric antireflection layer composed of $SiO_x$ completely avoids any influencing of the photoresist by neutralization of acidic constituents, with the result that there is no longer the risk of resist degradation.

The optical properties of the grown $SiO_x$ layer, i.e. the extinction coefficient k, which determines the absorption behavior, and the refractive index n, can be determined in a simple manner by setting or varying the Si content during the growth of the $SiO_x$ layer. This makes it possible, in a simple manner, to produce an adapted, optimally coordinated dielectric antireflection layer made of $SiO_x$ for the photoresist respectively applied.

As an alternative, when using an $SiO_x$ layer as an additional covering layer on an N-containing dielectric antireflection layer, it is possible, through suitable variation of the Si content, to form the $SiO_x$ layer such that it is slightly absorbent, thus resulting in the advantage of a double antireflection layer in which the lower actual antireflection layer is more highly absorbent in order to minimize the reflection influence of the base, and the upper $SiO_x$ additional layer enables an optimum optical coupling to the photoresist and thus an optimum interference extinction.

In accordance with a further preferred embodiment, the $SiO_x$ layer formation is carried out by vapor phase deposition, $SiH_4$ and $O_2$ being used as starting gases. The use of such starting gases without nitrogen reliably ensures that a completely N-free $SiO_x$ layer is produced in order to reliably avoid resist degradations.

In accordance with a further preferred embodiment, the $SiO_x$ layer formation is carried out in a reactor with a high plasma density and a separate gas inlet for $SiH_4$ and $O_2$, the $SiH_4$ flow being effected in an order of magnitude of 5 sccm to 100 sccm, preferably of 13 sccm, the $O_2$ flow being effected in an order of magnitude of 5 sccm to 100 sccm, preferably of 10 sccm, an inert gas flow, preferably with argon, being effected in an order of magnitude of 5 sccm to 1000 sccm, preferably of 50 sccm, a pressure in a reaction chamber being set to 1 mTorr to 10 mTorr, preferably 1.2 mTorr, a power being set to 1 kW to 5 kW, preferably 3 kW, and a temperature of 250 to 550° C., preferably of 400° C., being set. The use of a so-called HDP chamber gives rise to the possibility of mixing $SiH_4$ and $O_2$ in a defined manner only in the reaction space and of exciting them differently in the plasma, as a result of which the incorporation ratio of silicon to oxygen in the $SiO_x$ layer can be set precisely and an optimum N-free $SiO_x$ layer with corresponding optical properties can thus be produced.

Other features which are considered as characteristic for the invention are set forth in the appended claims.

Although the invention is illustrated and described herein as embodied in a method for fabricating a patterned layer on a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A and 1B are diagrammatic, sectional views of a semiconductor substrate with a dielectric antireflection layer during a photolithography process according to the prior art;

FIG. 1C is an enlarged, sectional view of the semiconductor substrate with the dielectric antireflection layer during a photolithography process according to the prior art;

FIGS. 2A–2G are sectional views through the semiconductor substrate showing successive method steps for fabricating a patterned layer in accordance with a first embodiment of the invention;

DESCRIPTION OF THE PREFERRED EMBODIMENTS

Figure 2E:
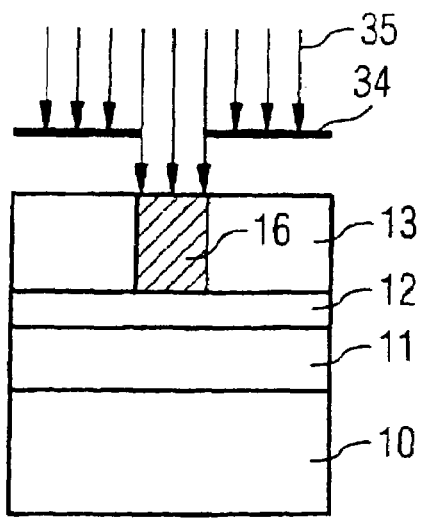
Figure 2F:
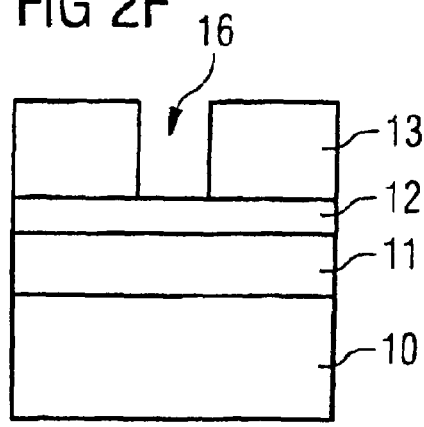
Figure 2G:
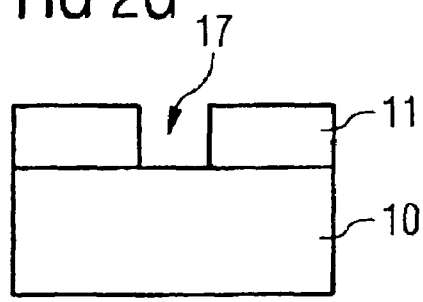

Referring now to the figures of the drawing in detail and first, particularly, to FIG. 1A thereof, there is shown diagrammatically a conventional method for processing a layer 31 on a semiconductor substrate 30. For this purpose, there is applied on the layer 31 an N-containing dielectric antireflection layer 32, preferably an SiON layer, whose stochiometry is set such that an absorption behavior which is desired for the photolithography is achieved, in order to reduce the intensity of the light reflected back during the exposure operation. An acid-forming photoresist layer 33, a positive resist in the exemplary embodiment illustrated, is then disposed on the antireflection layer 32.

The photoresist layer 33 is irradiated via an exposure mask 34 with the desired structure to be formed, the light radiation 35 initiating acid formation in the irradiated photoresist region 36, as illustrated in FIG. 1A. By developing the photoresist layer in an alkaline solution, as shown in FIG. 1B, an exposed region 36 is removed selectively with respect to the non-irradiated areas of the photoresist layer 33.

In the transition region with respect to the dielectric antireflection layer 32, however, as shown by the detail view of FIG. 1C, there is the risk of the formation of so-called resist feet which reduce the dimensional accuracy of the transfer of the structure and lead to undesired structural alterations during the subsequent etching operation for transferring the exposed structure into the layer 31. In the conventional photolithographic processes with a nitrogen-containing dielectric antireflection layer, the resist feet arise on account of an undesired interaction between the antireflection layer and the photoresist in the course of which nitrogen or amino groups at the surface of the antireflection layer act as bases and neutralize the acid of the interface that is formed in the photoresist. This reduces the solubility of the photoresist in this region and so-called resist residues remain in the bottom region after development.

In order to solve this problem, the invention proposes using a nitrogen-free $SiO_x$ layer above the nitrogen-containing antireflection layer or as an alternative to the latter, as a result of which undesired interactions with the photoresist layer disposed above are avoided and the production of resist feet is thus suppressed.

FIGS. 2A to 2G diagrammatically show a first embodiment of a method according to the invention for fabricating a patterned semiconductor layer, in which the $SiO_x$ layer is used directly as an antireflection layer.

FIG. 2A shows a cross section through a semiconductor substrate 10 at the beginning of the method according to the invention. In a first process step, as illustrated in FIG. 2B, a semiconductor layer 11 to be patterned is produced on the semiconductor substrate 10. A nitrogen-free $SiO_x$ layer 12 is deposited in turn, as shown in FIG. 2C, on the semiconductor layer 11 to be patterned, the layer 12 serving as a dielectric antireflection layer. In this case, the absorption properties of the $SiO_x$ layer 12 are determined by setting the Si content, which in this case may vary by way of the layer thickness, in order to obtain a desired refractive index n and extinction coefficient k with which the intensity of the light radiation reflected at the interfaces during the exposure process is minimized. The Si content is preferably set in such a way as to produce a stochiometric composition of the $SiO_x$ layer where x is less than 2.

As shown in FIG. 2D, the acid-forming photoresist layer 13 is applied on the $SiO_x$ layer 12 and, as illustrated in FIG. 2E, is then irradiated via the exposure mask 34, the exposure radiation effecting acid formation in the exposed regions of the photoresist layer 13. In a subsequent process step, with the aid of a developer liquid, the photoresist is dissolved in the exposed region 16, so that the structure of the exposure mask can be transferred to the photoresist layer 13 in a dimensionally accurate manner, FIG. 2F. After the development and curing of the photoresist layer 13, in further process steps, the structure produced in the photoresist layer 13 is then transferred to the layer 11 to be patterned and the photoresist layer and the underlying $SiO_x$ layer are subsequently removed again, so that a structure 17 corresponding to the exposure mask is formed in the semiconductor layer 11, FIG. 2G.

The nitrogen-free interface, that of the $SiO_x$ antireflection layer 12 and of the photoresist layer 13 deposited thereon, suppresses undesired interaction and thus reliably prevents the production of resist feet.

Figure 3:
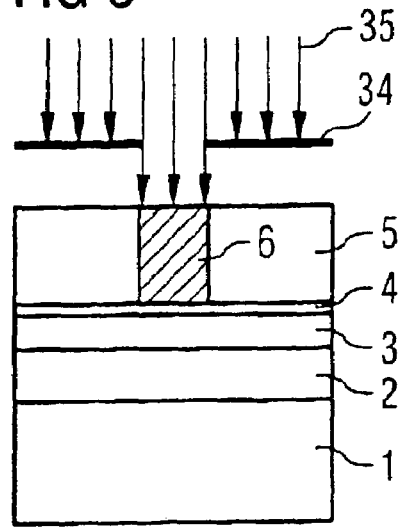
FIG. 3 is a sectional view through the semiconductor substrate during an exposure operation showing a method for fabricating the patterned layer in accordance with a second embodiment of the invention.

As an alternative to the method shown in FIGS. 2A–2G, in which the $SiO_x$ layer is used directly as a dielectric antireflection layer, it is possible, as shown in FIG. 3, for the $SiO_x$ layer also to be applied as an additional covering layer on a nitrogen-containing dielectric antireflection layer.

FIG. 3 illustrates the exposure process step with this alternative layer construction. A semiconductor layer 2 to be patterned is disposed on the semiconductor substrate 1, on which layer 2 there is formed, in turn, the nitrogen-containing dielectric antireflection layer 3, preferably an SiON layer, by whose stochiometry the desired absorption behavior is set. An N-free $SiO_x$ layer 4 is in turn produced on the nitrogen-containing antireflection layer 3, an acid-forming photoresist layer 5 being applied on the layer 4. The acid-forming photoresist layer 5 is irradiated with the exposure radiation 35 via the exposure mask 34 in order to initiate acid formation in an exposed region 6. Afterward, analogously to the embodiment shown in FIGS. 2A–2G, the photoresist can then be dissolved in the exposed region 6 with the aid of a developer liquid and, by a subsequent etching process, the structure formed in the photoresist layer can be transferred into the layer 2 lying below the antireflection layer.

The $SiO_x$ layer 4 can be set, with regard to its optical properties, in such a way that it serves as a pure nitrogen barrier without effecting light absorption, i.e. with an extinction coefficient k≈0. As an alternative, however, through corresponding setting of the Si content, the $SiO_x$ layer 4 can also be constructed such that it is slightly absorbent with an extinction coefficient k of up to approximately 0.3. In this case, the $SiO_x$ layer 4 acts together with the underlying antireflection layer 3 as a double layer which is preferably constructed in such a way that the lower dielectric nitrogen-containing antireflection layer 3 is greatly absorbent, whereas the $SiO_x$ layer, through corresponding setting of the refractive index n with the aid of the Si content, enables an optimum optical coupling to the photoresist deposited thereon, in order to optimally attenuate the reflected wave at the interface with the aid of the interference method. What is important, however, is that the risk of resist degradations is reliably avoided by use of the nitrogen-free $SiO_x$ layer 4 below the photoresist layer 5.

The application of the $SiO_x$ layer, both in the method shown in FIGS. 2A–2G, in which the $SiO_x$ layer is used as an antireflection layer, and in the method shown in FIG. 3, in which the $SiO_x$ layer is provided as an additional covering layer on the antireflection layer 3, is preferably performed with the aid of vapor phase deposition, $SiH_4$ and $O_2$ preferably being used as starting gases, thereby ensuring nitrogen-free layer formation. In this case, apparatuses used for the vapor phase deposition of the $SiO_x$ layer are preferably those techniques in which the two gases $SiH_4$ and $O_2$ can be fed separately into a reaction chamber, as a result of which a precisely defined gas mixture can be achieved.

Figure 4A:
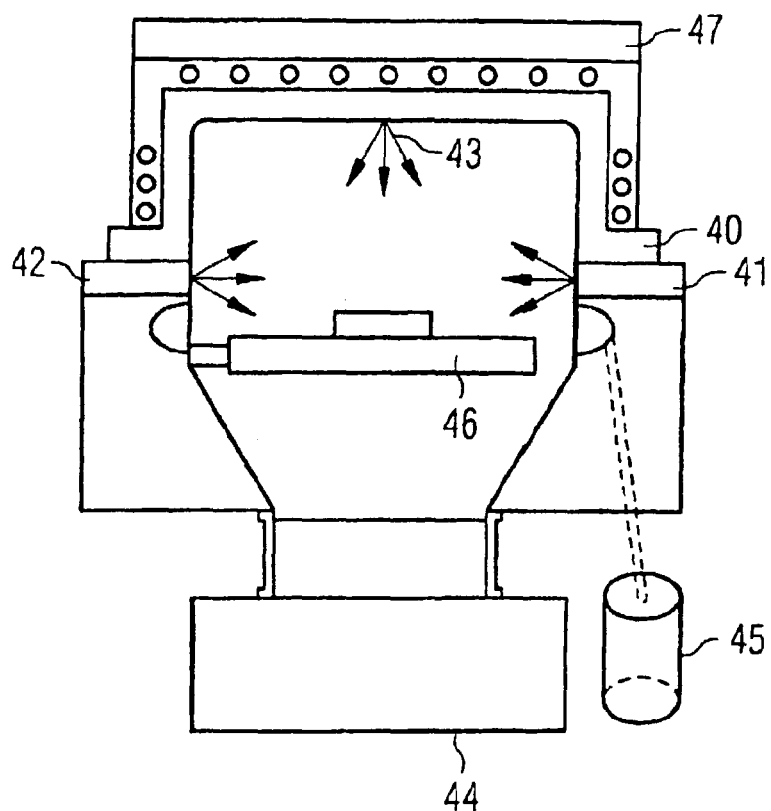
FIG. 4A is a diagrammatic, cross-sectional view of an HDP deposition chamber for use in the method according to the invention.

In this case, the layer fabrication is preferably effected in a reaction chamber with a high plasma density (HDP), preferably an HDP installation, as is illustrated in FIG. 4A. The HDP installation has a closed reaction chamber 40 in which three gas inlets 41, 42, 43 are provided, by which the two reaction gases $O_2$ and $SiH_4$ and also an inert gas, preferably argon, can be fed in. Furthermore, a vacuum pump configuration 44 for producing a high vacuum in the reaction chamber 40 and also a cleaning device 45 are provided on the reaction chamber 40.

The semiconductor wafer on which the $SiO_x$ layer is to be produced is disposed on a preferably heatable carrier plate 46 in the reaction chamber 40. In order to produce plasma from the gases fed in, coils 47 are disposed around the reaction chamber 40, which coils act as an inductively coupled plasma source and provide for a high plasma density. Furthermore, a heating device 47 is also provided on the HDP reactor in order to set the desired temperature in the reaction chamber 40.

In order to achieve an optimum $SiO_x$ deposition and, in the process, to be able to vary the Si content in the desired range, the HDP reactor, as is shown in FIG. 4A, is preferably operated with the following process conditions. The $SiH_4$ flow ranges from 5 to 100 sccm and is preferably set to 13 sccm in this case. $O_2$ is fed in with a flow of 5 sccm to 100 sccm, preferably 10 sccm. The inert gas flow preferably ranges from 5 sccm to 1000 sccm, and is preferably 50 sccm. During the $SiO_x$ deposition, a pressure of 1 mTorr to 10 mTorr, preferably 1.2 mTorr prevails in the reactor chamber. The coils 47 for inductive plasma generation are operated with a power of 1 kW to 5 kW, preferably 3 kW, a temperature of 250° C. to 550° C., preferably 400° C., being set in the reactor chamber 40. As an alternative to a plasma dilution with argon as inert gas, helium, for example, may also be used.

Figure 4B:
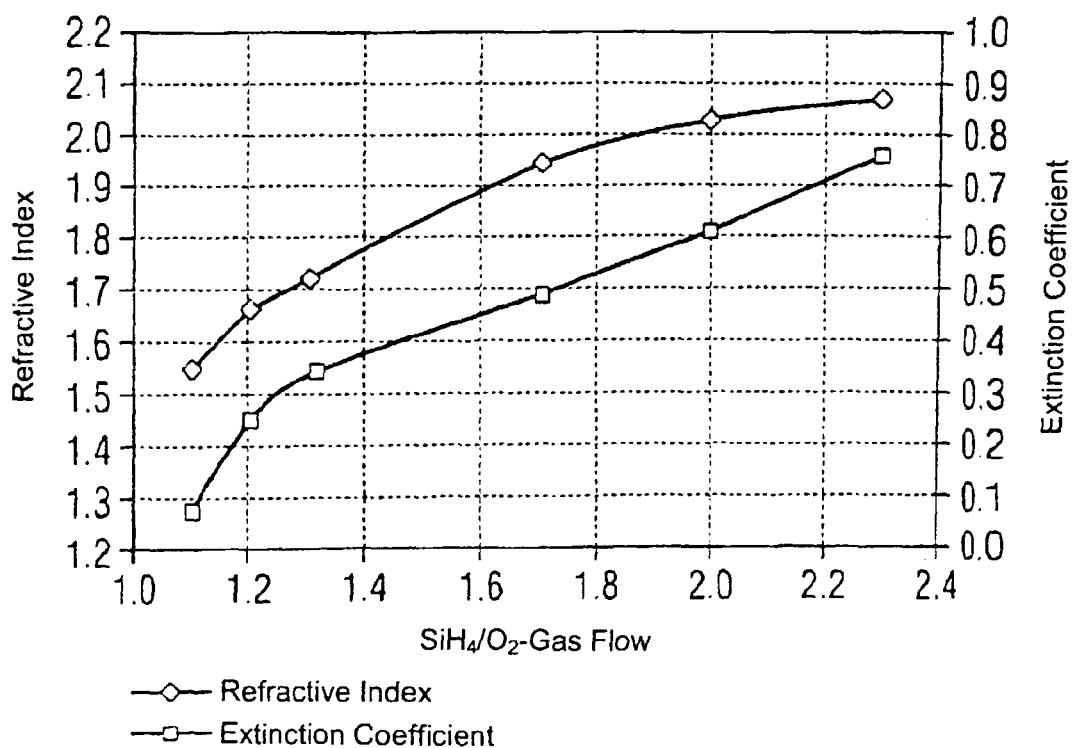
FIG. 4B is a graph illustrating the setting of the absorption behavior of the $SiO_x$ layer grown using the chamber as a function of the $SiH_4/O_2$ flow.

Through suitable variation of the $SiH_4/O_2$ gas flow, it is possible in this case to form a $SiO_x$ layer with the desired optical properties, i.e. with a precisely set refractive index n and extinction coefficient k, on the semiconductor wafer. The refractive index n and the extinction coefficient k of the $SiO_x$ wafer as a function of the $SiH_4/O_2$ gas flow ratio is illustrated in FIG. 4B.

Features of the invention that are disclosed in the above description, the claims and the drawings may be essential both individually and in any desired combination for the realization of the invention in its various embodiments.

We claim:

1. A method for fabricating a patterned layer, which comprises the steps of:
   providing a semiconductor substrate having a layer to be patterned;
   producing an N-containing dielectric antireflection layer on the layer to be patterned;
   producing an N-free $SiO_x$ layer on the N-containing dielectric antireflection layer, the N-free $SiO_x$ layer being formed by using a vapor phase deposition process, with $SiH_4$ and $O_2$ being used as starting gases, the Si content of the N-free $SiO_x$ layer being varied such that the N-free $SiO_x$ layer is slightly absorbent;
   producing a photoresist layer on the N-free $SiO_x$ layer;
   exposing the photoresist layer for imaging a predetermined structure on the photoresist layer;
   developing the photoresist layer for forming the photoresist layer in accordance with the predetermined structure imaged during the exposure resulting in a photoresist structure; and
   transferring the photoresist structure to the layer for patterning the layer.

2. The method according to claim 1, which further comprises forming the N-containing dielectric antireflection layer as a SiON layer.

3. The method according to claim 1, which further comprises varying a Si content of the N-free $SiO_x$ layer to set a desired extinction coefficient k and a desired refractive index n.

4. The method according to claim 1, which further comprises effecting a formation of the N-free $SiO_x$ layer in a reactor with a high plasma density and separate gas inlets for the $SiH_4$ and the $O_2$, under the following parameters:
   $SiH_4$ flow of 5 sccm to 100 Sccm;
   $O_2$ flow of 5 sccm to 100 sccm;
   inert gas flow of 5 sccm to 1000 sccm;
   pressure of 1 mTorr to 10 mTorr;
   power of 1 kW to 5 kW; and
   temperature of 250° C. to 550° C.

5. The method according to claim 4, which further comprises using a high density plasma reactor as the reactor under the following parameters:
   $SiH_4$ flow of 13 sccm;
   $O_2$ flow of 10 sccm;
   Ar gas flow of 50 sccm;
   pressure of 1.2 mTorr;
   power of 3 kW; and
   temperature of 400° C.

6. A method for fabricating a patterned layer, which comprises the steps of:
   providing a semiconductor substrate having a layer to be patterned;
   producing a Si-rich N-free $SiO_x$ layer as a dielectric antireflection layer on the layer to be patterned, where x is less than 2, the Si content of the N-free $SiO_x$ layer being varied such that the N-free $SiO_x$ layer is slightly absorbent;
   producing a photoresist layer on the Si-rich N-free $SiO_x$ layer;
   exposing the photoresist layer for imaging a predetermined structure on the photoresist layer;
   developing the photoresist layer for forming the photoresist layer in accordance with the predetermined structure imaged during the exposure resulting in a photoresist structure; and
   transferring the photoresist structure to the layer for patterning the layer.

7. The method according to claim 6, which further comprises varying a Si content of the Si-rich N-free $SiO_x$ layer to set a desired extinction coefficient k and a desired refractive index n.

8. The method according to claim 6, which further comprises effecting a formation of the Si-rich N-free $SiO_x$ layer using a vapor phase deposition process, $SiH_4$ and $O_2$ being used as starting gases.

9. The method according to claim 8, which further comprises effecting the formation of the Si-rich N-free $SiO_x$ layer in a reactor with a high plasma density and separate gas inlets for the $SiH_4$ and the $O_2$, under the following parameters:
   $SiH_4$ flow of 5 sccm to 100 sccm;
   $O_2$ flow of 5 sccm to 100 sccm;
   inert gas flow of 5 sccm to 1000 sccm;
   pressure of 1 mTorr to 10 mTorr;
   power of 1 kW to 5 kW; and
   temperature of 250° C. to 550° C.

10. The method according to claim 9, which further comprises using a high density plasma reactor as the reactor under the following parameters:
    $SiH_4$ flow of 13 sccm;
    $O_2$ flow of 10 sccm;
    Ar gas flow of 50 sccm;
    pressure of 1.2 mTorr;
    power of 3 Kw; and
    temperature of 400° C.

* * * * *